United States Patent

Wong et al.

[11] Patent Number: 5,982,229
[45] Date of Patent: Nov. 9, 1999

[54] SIGNAL PROCESSING SCHEME UTILIZING OVERSAMPLED SWITCHED CAPACITOR FILTER

[75] Inventors: See-Hoi Caesar Wong, Fremont; Edward Liu, Sunnyvale, both of Calif.

[73] Assignee: LSI Logic Corporation, Milpitas, Calif.

[21] Appl. No.: 08/971,428

[22] Filed: Nov. 17, 1997

[51] Int. Cl.[6] ...................................................... H03K 5/00
[52] U.S. Cl. .................................. 327/554; 327/94; 330/9
[58] Field of Search ..................................... 327/552, 554, 327/94, 100; 330/9

[56] References Cited

U.S. PATENT DOCUMENTS 5,245,344 9/1993 Sooch ...................................... 341/150

Primary Examiner—Dinh T. Le
Attorney, Agent, or Firm—Mitchell Silberberg & Knupp LLP

[57] ABSTRACT

A novel signal processing scheme comprises a digital to analog converter which is clocked at a first frequency, and a switched capacitor filter which receives input from the digital to analog converter and is clocked at a second frequency which is a multiple N times the first frequency. A preferred version of the present invention further comprises an analog signal sychronization circuit which allows the switched capacitor filter to oversample output from the digital to analog converter. The analog signal sychronization circuit comprises a sample and hold circuit, which receives input from the digital to analog converter and holds the input so that the switched capacitor filter can sample the same input N times, and a digital clock generator, which clocks the sample and hold circuit such that the sample and hold circuit only samples settled and valid output data from the digital to analog converter. An RC active filter receives input from the switched capacitor filter and rejects signal images at the first and higher frequencies.

18 Claims, 1 Drawing Sheet

SIGNAL PROCESSING SCHEME UTILIZING OVERSAMPLED SWITCHED CAPACITOR FILTER

BACKGROUND OF THE INVENTION

1. Field of the Invention

This invention relates to a signal processing scheme utilizing an oversampled switched capacitor filter.

2. Description of the Related Art

Transmitters such as wireless baseband transmitters must convert digital codes from a digital modulator to analog voltages. Conventional signal processing schemes employed for this purpose comprise a digital-to-analog converter (DAC), a switched capacitor filter (SCF) to suppress spurious signals that would interfere with adjacent channels, and an RC active filter (RCF) to further reduce such interference and reject signal images at the operating frequency of the SCF and its multiples. The RCF in these conventional schemes is typically a fourth or higher order filter requiring many high precision capacitors and resistors.

To create these components, implementation of the RCF of the conventional scheme requires use of enhanced analog chip fabrication processes. Such processes require several extra masks, which entail higher production costs and increased development time. By contrast, digital chip fabrication processes are cheaper and can be developed faster, but do not provide high precision capacitors and resistors. These components must be provided off-chip, requiring connections to I/O pads with high parasitic capacitance. Productions costs increase as more high precision off-chip components are required.

Therefore, an object of this invention is to provide a signal processing scheme for digital to analog conversion which is suitable for implementation by digital processes and requires a minimum number of off-chip components.

SUMMARY OF THE INVENTION

This object is achieved by the present invention, which comprises a digital to analog converter which is clocked at a first frequency, and a switched capacitor filter which receives input from the digital to analog converter and is clocked at a second frequency which is a multiple N times the first frequency. As a result of this novel scheme, the rejection requirement for filters needed to reject signal images generated at the first frequency is relaxed by a factor of N. Therefore, filters of lesser order as compared to the conventional scheme can be used. This translates into a substantial reduction in the number of off-chip components required.

A preferred version of the present invention further comprises an analog signal sychronization circuit which allows the switched capacitor filter to oversample output from the digital to analog converter. The analog signal sychronization circuit comprises a sample and hold circuit, which receives input from the digital to analog converter and holds the input so that the switched capacitor filter can sample the same input N times, and a digital clock generator, which clocks the sample and hold circuit such that the sample and hold circuit only samples settled and valid output data from the digital to analog converter. An RC active filter receives input from the switched capacitor filter and rejects signal images at the first and higher frequencies. In a preferred version, the present invention further comprises a buffer driver connected between the switched capacitor filter and the RC active filter.

These and other aspects, features, and advantages of the present invention will be apparent to those persons having ordinary skill in the art to which the present invention relates from the foregoing description and the accompanying drawings.

DESCRIPTION OF THE PREFERRED EMBODIMENTS

Figure 1:
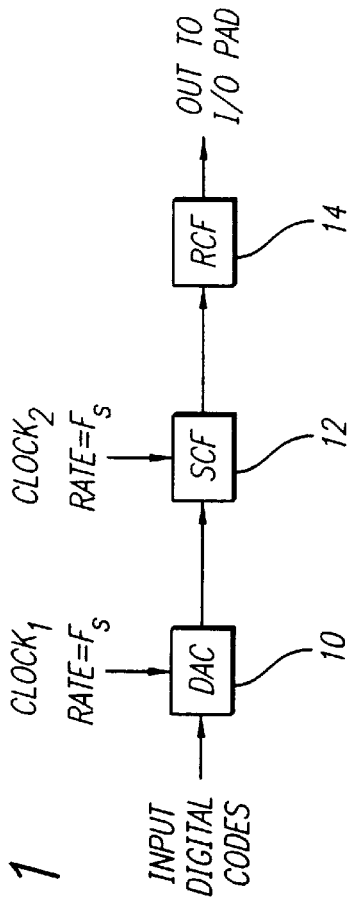
FIG. 1 is a block diagram of a conventional signal processing scheme.

FIG. 1 is a schematic of a conventional signal processing scheme, which comprises a digital to analog converter (DAC) 10, a switched capacitor filter (SCF) 12, and an RC active filter (RCF) 14. The DAC 10 and SCF 12 are both clocked at the same frequency Fs. The RCF 14 in conventional schemes is typically a fourth or higher order filter requiring many high precision capacitors and resistors. To create such components, implementation of the RCF 14 of the conventional scheme requires use of enhanced analog chip fabrication processes. Such processes require several extra masks, which entail higher production costs and increased development time.

As compared to analog chip fabrication processes, digital chip fabrication processes are cheaper and can be developed faster, but do not provide high precision capacitors and resistors. These components must be provided off-chip, requiring connections to I/O pads with high parasitic capacitance. Production costs increase as more high precision off-chip components are required, and such components can be relatively expensive. The present invention solves this problem by providing a signal processing scheme which is suitable for implementation by digital processes, while requiring a minimum number of off-chip components.

Figure 2:
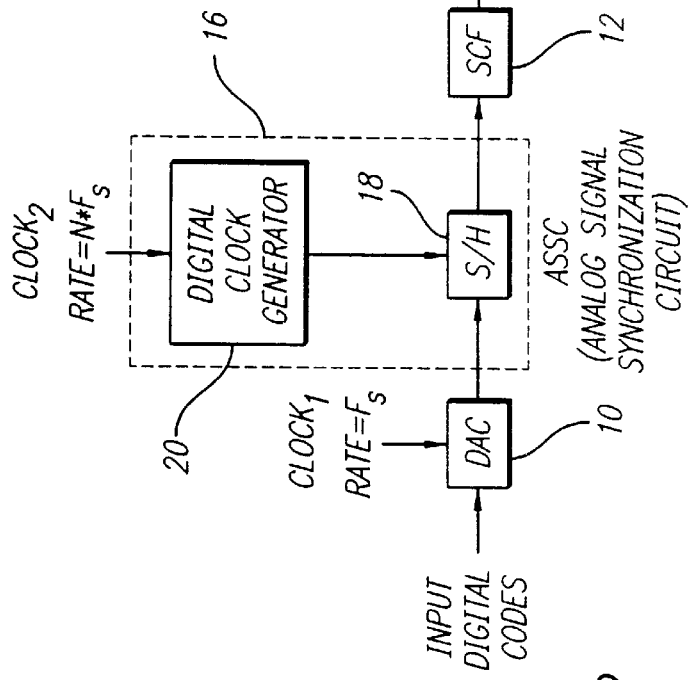
FIG. 2 is a block diagram of a preferred embodiment of the present invention.

FIG. 2 shows a preferred version of the present invention, which comprises a DAC 10 clocked a first frequency Fs, and a SCF 12 which receives input from the DAC 10. The SCF 12 is clocked at a second frequency which is a multiple N times the first frequency Fs.

In a preferred version, the signal processing system of the present invention further comprises an analog signal sychronization circuit (ASSC) 16 which allows oversampling at the SCF 12. The ASSC 16 comprises a sample and hold circuit (S/H) 18, which receives input from the DAC 10 and holds the input so that the SCF 12 can sample the same input N times, and a digital clock generator 20 which clocks the S/H 18 such that the S/H 18 only samples settled and valid output data from the DAC 10. The digital clock generator 20 ensures that no information is lost between the DAC 10 and the SCF 12; the S/H 18 must sample the final, settled output value from the DAC 10 before each DAC clock cycle ends and the DAC output value becomes invalid. The design of circuitry to implement the digital clock generator 20 is well-known to those skilled in the art.

Use of oversampling in the present invention translates into relaxed rejection requirements for the RCF 14. While the first undesirable image from the SCF 12 is located at Fs for a conventional signal processing scheme, such an image is located at N*Fs for the present invention. In other words, the rejection requirement is relaxed by a factor of N. Thus, the higher the oversampling ratio N, the lower the order of the RCF 14.

Substantial reductions in the number of off-chip components are achieved by the present invention. For example, one system embodying a preferred version of the present invention achieved a reduction of fifty percent. In this version, N was chosen to be four, which allowed use of a second order RCF with only nine off-chip components. By contrast, a corresponding conventional system not embodying the present invention would require use of a fourth order RCF with eighteen off-chip components. Increasing N further reduces the number of off-chip components. For example, for N equal to eight, a first order filter requiring only two off-chip components can be used. Moreover, no on-chip amplifier is needed for a first order filter, whereas an on-chip amplifier is typically required for a second or higher order RCF.

In a conventional scheme employing off-chip components, the SCF 12 must drive large parasitic capacitances present at input/output (I/O) pads leading to such components. It would be inefficient in terms of power consumption to tune the SCF 12 to drive these capacitances. Therefore, a preferred version of a signal processing system according to the present invention further comprises a buffer driver 22 connected between the SCF 12 and the RCF 14. The buffer driver 22 isolates the SCF 12 from the I/O pads. Since the signal bandedge is much smaller than the clock rate of the SCF 12, the required bandwidth for the buffer driver is very modest.

Although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiment shown in the drawings and described in detail hereinabove. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. § 112 ¶ 6.

What is claimed is:

1. A signal processing system comprising:

a digital to analog converter which is clocked at a first frequency;

a switched capacitor filter which receives input from the digital to analog converter and outputs a filtered signal, wherein the switched capacitor filter is clocked at a second frequency which is a multiple N times the first frequency, wherein N is greater than one; and an analog signal synchronization circuit which facilitates sampling of an output signal from the digital to analog converter at the second frequency, thereby allowing the switched capacitor filter to oversample said output signal from the digital to analog converter.

2. The signal processing system of claim 1, wherein the analog signal synchronization circuit is connected between the digital to analog converter and the switched capacitor filter, and samples output from the digital to analog converter at the second frequency.

3. The signal processing system of claim 2, wherein the analog signal synchronization circuit comprises a sample and hold circuit which receives said output signal from the digital to analog converter and holds said output signal so that the switched capacitor filter can oversample the output signal N times.

4. The signal processing system of claim 3, wherein the analog signal synchronization circuit further comprises a digital clock generator, which clocks the sample and hold circuit such that the sample and hold circuit samples said output signal from the digital to analog converter.

5. The signal processing system of claim 1, further comprising a second filter which receives said filtered signal from the switched capacitor filter.

6. The signal processing system of claim 5, wherein the second filter comprises an RC active filter.

7. The signal processing system of claim 5, further comprising a buffer driver connected between the switched capacitor filter and the second filter.

8. A signal processing system comprising:

a digital to analog converter which is clocked at a first frequency;

a switched capacitor filter which receives input from the digital to analog converter and outputs a filtered signal, wherein the switched capacitor filter is clocked at a second frequency which is a multiple N times the first frequency, wherein N is greater than one; and an analog signal synchronization circuit connected between the digital to analog converter and the switched capacitor filter, which samples an output signal from the digital to analog converter at the second frequency, thereby allowing the switched capacitor filter to oversample said output signal from the digital to analog converter, wherein the analog signal synchronization circuit comprises:

a sample and hold circuit which receives said output signal from the digital to analog converter and holds said output signal so that the switched capacitor filter can oversample the output signal N times, and a digital clock generator, which clocks the sample and hold circuit such that the sample and hold circuit samples said output signal from the digital to analog converter.

9. The signal processing system of claim 8, further comprising a second filter which receives said filtered signal from the switched capacitor filter.

10. The signal processing system of claim 9, wherein the second filter comprises an RC active filter.

11. The signal processing system of claim 9, further comprising a buffer driver connected between the switched capacitor filter and the second filter.

12. A method for use in signal processing, comprising the steps of:

clocking a digital to analog converter at a first frequency;

clocking a switched capacitor filter, which receives input from the digital to analog converter and outputs a filtered signal, at a second frequency which is a multiple N times the first frequency, wherein N is greater than one; and utilizing an analog signal synchronization circuit which facilitates sampling of an output signal from the digital to analog converter at the second frequency, thereby allowing the switched capacitor filter to oversample said output signal from the digital to analog converter.

13. The method of claim 12, wherein the analog signal synchronization circuit is connected between the digital to analog converter and the switched capacitor filter, and samples output from the digital to analog converter at the second frequency.

14. The method of claim 13, wherein the step of utilizing an analog signal synchronization circuit comprises sampling and holding said output signal from the digital to analog converter so that the switched capacitor filter can oversample the output signal N times.

15. The method of claim 14, wherein the step of sampling and holding comprises clocking a sample and hold circuit such that the sample and hold circuit samples said output signal from the digital to analog converter.

16. The method of claim 12, further comprising the step of filtering said filtered signal from the switched capacitor filter such that signal images are rejected.

17. The method of claim 16, wherein the step of filtering said filtered signal is accomplished using an RC active filter.

18. The method of claim 16, further comprising the step of buffering the filtered signal output from the switched capacitor filter before filtering said filtered signal.

* * * * *